United States Patent
Fujiwara

(10) Patent No.: US 6,909,883 B2
(45) Date of Patent: Jun. 21, 2005

(54) WIRELESS COMMUNICATION DEVICE

(75) Inventor: Masanao Fujiwara, Tokyo (JP)

(73) Assignees: Micro FT Co., Ltd., Tokyo (JP); Excel Engineering Co., Ltd., Tokyo (JP)

( * ) Notice: Subject to any disclaimer, the term of this patent is extended or adjusted under 35 U.S.C. 154(b) by 540 days.

(21) Appl. No.: 10/183,504

(22) Filed: Jun. 28, 2002

(65) Prior Publication Data

US 2003/0003884 A1 Jan. 2, 2003

(30) Foreign Application Priority Data

Jun. 28, 2001 (JP) ........................... 2001-195999
Apr. 10, 2002 (JP) ........................... 2002-107470

(51) Int. Cl.[7] .............................................. H04B 1/40
(52) U.S. Cl. ..................... 455/84; 455/118; 455/131; 455/313; 331/158
(58) Field of Search ..................... 455/73, 75, 76, 455/83, 84, 85, 86, 110, 112, 113, 118, 131, 255, 257, 313, 334, 338, 318, 323; 331/154, 158; 340/539.1, 539.11, 539.14, 539.15

(56) References Cited

U.S. PATENT DOCUMENTS 3,913,017 A * 10/1975 Imaseki ................... 455/422.1
4,218,773 A * 8/1980 Imamura ................. 455/186.1
4,501,018 A * 2/1985 Shanley et al. ............... 455/83
6,219,531 B1 * 4/2001 Roberts et al. ............... 455/73

* cited by examiner

Primary Examiner—Quochien B. Vuong
(74) Attorney, Agent, or Firm—Kubovcik & Kubovcik

(57) ABSTRACT

A receiving section has one crystal resonator 122, an inductor 124 able to be connected in series to the crystal resonator 122, and a channel change-over switch 123 for switching whether the inductor 124 is connected to the crystal resonator 122 and the ground, or the crystal resonator 122 is directly connected to the ground, and an adjusting change-over switch 125. A transmitting section has one crystal resonator 321, plural frequency setting adjusting circuits 312,313 each including an inductor 314,316 for determining a frequency oscillated from an oscillator, and a switching connection switch 318 for switching and connecting one of the plural frequency setting adjusting circuits 312,313 to a modulating circuit 320 connected to the crystal resonator 321.

6 Claims, 5 Drawing Sheets

RECEIVER BLOCK DIAGRAM

WIRELESS COMMUNICATION DEVICE

BACKGROUND OF THE INVENTION

1. Technical Field

This invention relates to a wireless communication device for transmitting and receiving information by using a wireless frequency band of 10 [MHz] to 5 [GHz].

2. Description of the Prior Art

A baby monitor for hearing a baby's voice from a separated room (within the range from 5, 6 meters to 150 meters) as a device in a "toy commodity market" for children used in e.g., the interior of the United States of America is known as a conventional wireless communication device. In this baby monitor, a two-crystal system of two channels is adopted in a receiver and crystal control FM (frequency modulation) of two channels is adopted in a transmitter so that information transmission and reception corresponding to the two channels can be performed.

A monitor/hand-free mutual communication system is disclosed in U.S. Pat. No. 6,091,329 as a system having the two crystals on the receiving and transmitting sides of the wireless communication device. In the wireless communication device of this U.S. Pat. No. 6,091,329, an RF circuit from an antenna high frequency (RF) circuit to a demodulating circuit (FM ratio detector) is constructed by arranging six transistors and two demodulation wave detection diodes. In this circuit construction, crystal resonators are required in a local oscillating circuit by the number of channels as using frequencies. Namely, this wireless communication device has two crystal resonators on each of the transmitting and receiving sides to cope with the two channels, and selects each channel by a switch. The local oscillating circuit generally has a variable capacitor to finely adjust an oscillating frequency of about several [Hz] in each crystal resonator. With respect to such technical specification of the wireless communication device such as the baby monitor, for example, the wireless communication device is produced as a device conforming to the standard of America Federal Communications Commission (FCC) as an administrative committee in an information-communication field in the United States of America.

However, in the circuit construction of the conventional wireless communication device, the RF circuit from the antenna high frequency circuit to the demodulating circuit (FM ratio detector) is constructed by six transistors and two demodulation wave detection diodes, using no crystal resonator. Further, the band of an intermediate frequency amplifying circuit is widened to compensate an unstable characteristics in the local oscillator. Therefore, a problem existed in that receiving sensitivity is very bad. On the other hand, when a crystal resonator and a variable capacitor for finely adjusting the oscillating frequency of the oscillator is arranged, the range of the finely adjustable frequency is a narrow range of about several [Hz]. Therefore, a problem existed in that the oscillating frequency becomes unstable when the oscillating frequency exceeds this range.

Further, in the conventional wireless communication device, expensive crystal resonators (crystal oscillators), variable capacitors for finely adjusting the oscillating frequency, etc. are required by the number of channels for communicating information in the local oscillating circuit. When this channel number is two or more, a problem exists in that device cost is raised and device size is increased contrary to the need of compactness, etc.

SUMMARY OF THE INVENTION

In view of the above problems, an object of this invention is to provide a wireless communication device able to transmit and receive information in plural channels, and made compact at low cost and having a high general purpose property and satisfying a standard such as America Federal Communications Commission (FCC).

To solve the above problems, this invention resides in a wireless communication device having a local oscillating section for oscillating a frequency for converting a wirelessly transmitted and received signal to a signal in an intermediate frequency band, wherein the local oscillating section has a single crystal resonator, an inductor and a switch for switching whether the inductor is connected in series to the crystal resonator or not, and a receiving channel is switched by whether the inductor is connected or not.

To solve the above problems, this invention also resides in a wireless communication device having a modulating section for frequency-modulating an inputted information signal, wherein the modulating section has a single crystal resonator, a modulating circuit for deviating an oscillating frequency provided by the crystal resonator by the inputted information signal, an inductor connected in series to the crystal resonator, and a switch for switching inductance of the inductor, and a transmitting channel is switched by switching this inductance.

This invention may be also constructed as a transmitting-receiving system for transmitting and receiving wireless information by using a single or plural wireless communication devices each having a receiving section having the local oscillating section, and a single or plural wireless communication devices each having a transmitting section having the modulating section.

MODE FOR CARRYING OUT THE INVENTION

In a preferable embodiment mode of the wireless communication device of this invention, the local oscillating section has a transistor having a base connected to one end of the crystal resonator, a capacitor connected between the base and an emitter of the transistor, an emitter resistor for connecting the emitter to the ground, and a parallel resonating circuit connected in parallel with the emitter resistor and synchronized with the frequency of about an integer times a fundamental frequency of the crystal resonator. The switch switches whether the other end of the crystal resonator is directly connected to the ground, or the other end of the crystal resonator is connected to the ground through the inductor, and capacitance of the capacitor is switched in association with this switching. Further, the switch further switches a resistance value of the emitter resistor in association with the switching of the receiving channel.

In a preferable embodiment mode of the wireless communication device of this invention, a resistor is connected in parallel with the inductor, and its resistance value is switched in association with the switching of the transmitting channel. Further, in this embodiment mode, a level of the inputted information signal is switched in association with the switching of the transmitting channel.

Figure 1:
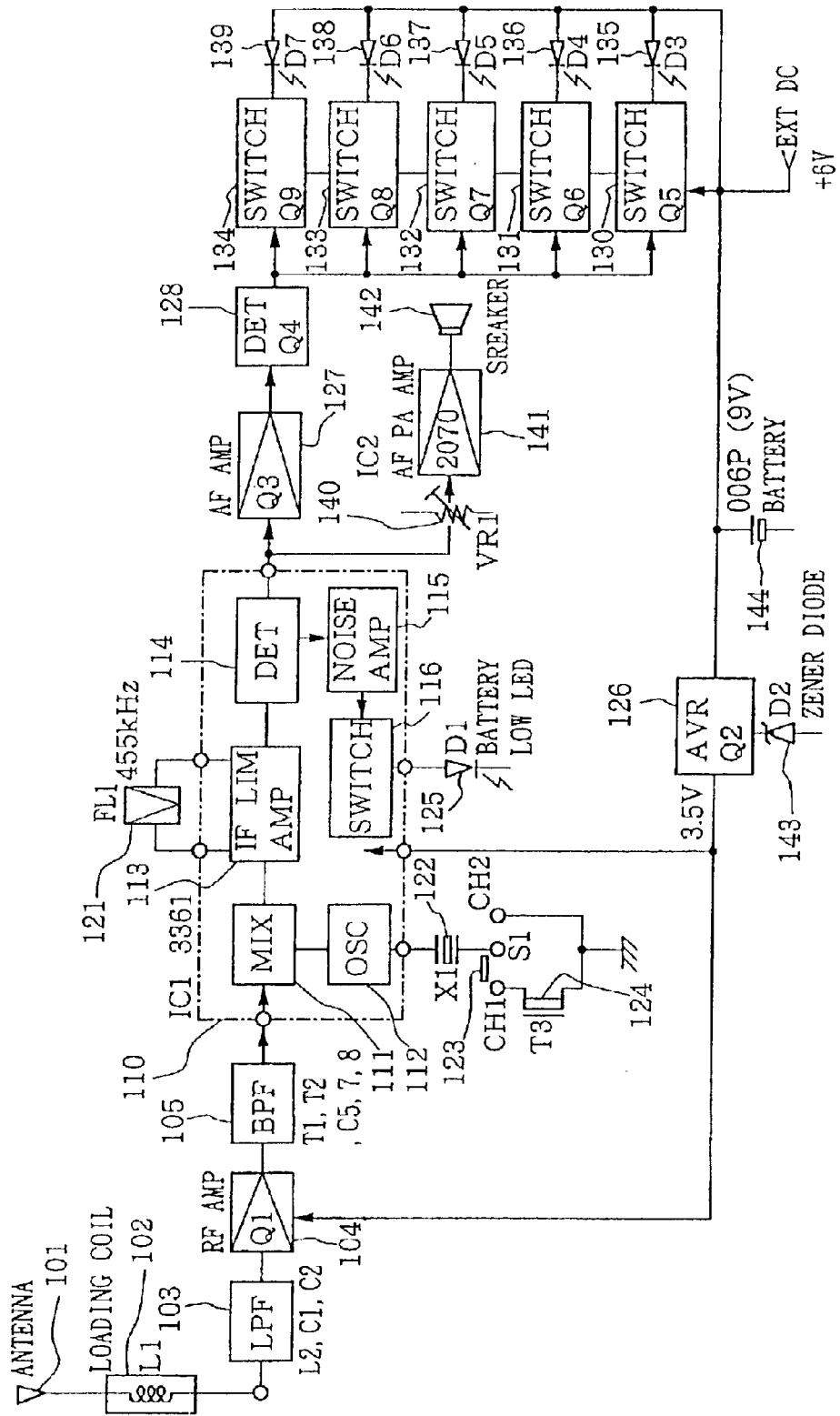
FIG. 1 is a block diagram showing the circuit construction of a receiving section of a wireless communication device in accordance with one embodiment of this invention.

DESCRIPTION OF THE REFERENCE NUMERALS AND SIGNS 101, 327: antenna, 102, 325: loading coil, 103, 324: low pass filter, 104: high frequency amplifying circuit, 105: band pass filter, 110: IC1, 111: mixer circuit, 112: oscillator circuit, 113: intermediate frequency limiter amplifying circuit, 114: quadrature demodulating circuit, 115: noise amplifying circuit, 116, 130, 131, 132, 133, 134: switch, 122, 321: crystal resonator (crystal oscillator), 123: change-over switch, 124, 208, 314, 316: inductor, 125, 135, 136, 137, 138, 139: light emitting diode, 126, 323: constant voltage circuit, 127, 302: low frequency amplifying circuit, 128: level detecting circuit, 140: volume circuit, 141: low frequency power amplifying circuit, 142: speaker, 143: zener diode, 144: battery, 201: transistor, 202, 203, 206, 209, 311: capacitor, 204, 207, 309, 310, 315, 317: resistance circuit, 205: adjusting change-over switch, 301: microphone, 303: modulation low frequency limiter amplifying circuit, 304: low frequency microphone amplifying circuit, 305: level control circuit, 306: low frequency wave detecting circuit, 308: resistance circuit for voice level control, 312, 313: frequency setting adjusting circuit, 318: frequency switching connection switch, 319: level control switching connection switch, 320: modulating circuit, 320a: variable capacitor for modulation, 320b: inductor arranged in modulating circuit, 322: high frequency amplifying and oscillating circuit, 326: AC adaptor, 327, 328: resistor.

Embodiment

The embodiments of this invention will next be explained in detail by using the drawings.

Embodiment of Receiving Section

Figure 2:
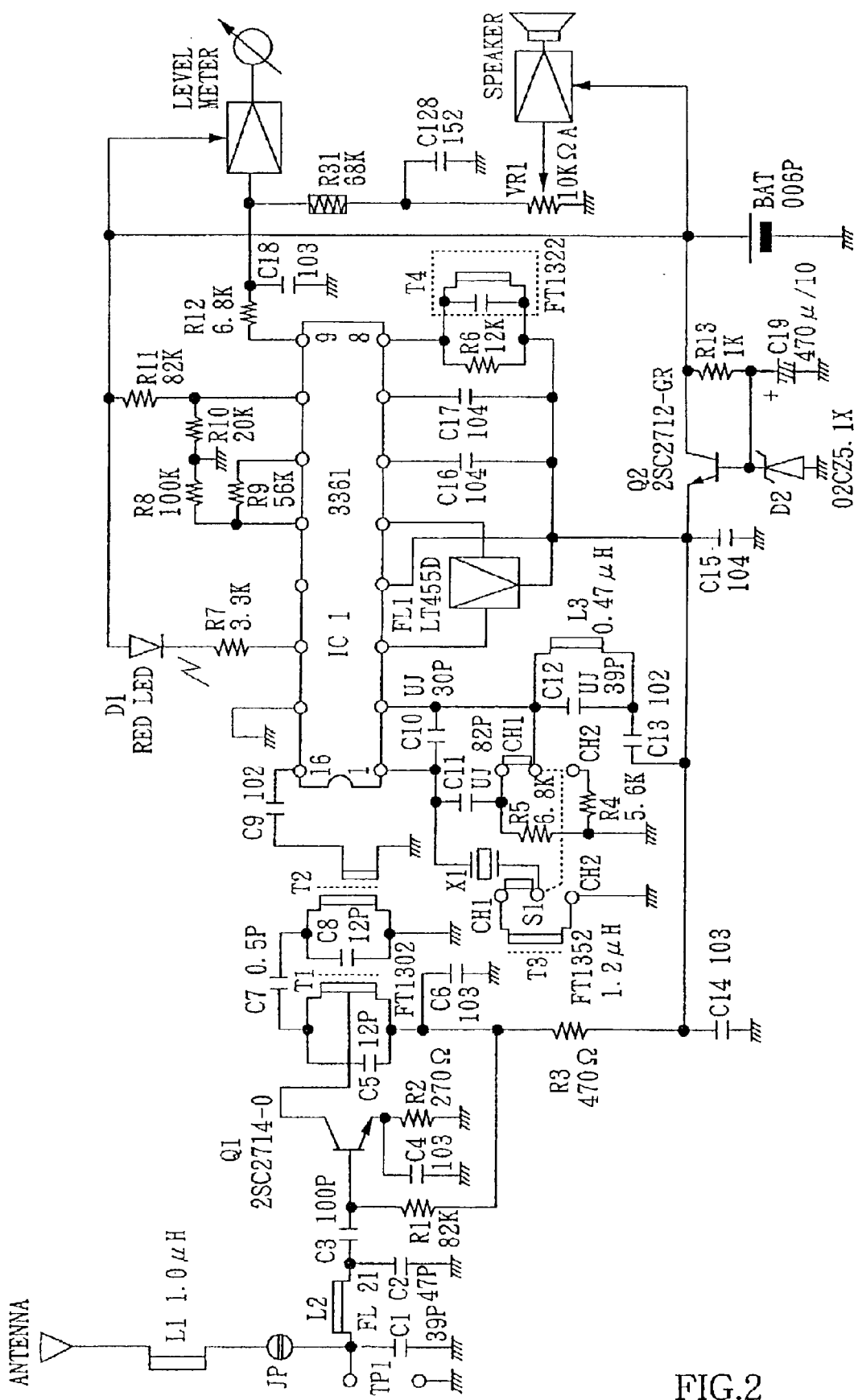
FIG. 2 is a view showing one concrete example of circuits shown in FIGS. 1 and 3.

FIG. 1 is a block diagram showing the circuit construction of a receiving section of a wireless communication device in accordance with one embodiment of this invention. FIG. 2 is a view showing one concrete example of circuits shown in FIG. 1 and FIG. 3 described later. In FIG. 2, the same reference numerals, signs and characters as FIGS. 1 and 3 designate members similar to those in FIGS. 1 and 3.

In FIG. 1, a receiving signal (e.g., a modulating signal including voice information) received by an antenna 101 is inputted to a low pass filter (LPF) 103 having an inductor and a capacitor (L2, C1, C2) through a loading coil 102 so that an unnecessary high frequency component is removed from the receiving signal. Here, an unillustrated junction point (JP) exists between the loading coil 102 and the low pass filter 103, and is constructed such that the loading coil 102 and the low pass filter 103 are connected by solder, etc. Since the receiving section has this JP, the receiving section can be easily constructed such that no unnecessary receiving signal is received from the antenna 101 when a test, an inspection, etc. of the receiving section are made. Therefore, the JP is convenient in the test, the inspection, etc.

An output signal from the low pass filter 103 is inputted to a high frequency amplifying circuit (RF AMP:Q1) 104. After high frequency amplification processing, the output signal is inputted to a band pass filter (BPF) 105 having an inductor and a capacitor (T1, T2, C5, C7, C8). Here, a direct current voltage (DC) 3.5 [V] is applied to the high frequency amplifying circuit 104 as a power voltage. The DC 3.5 [V] is generated by a constant voltage circuit (AVR Q2) 126 and a Zener diode (D2) 143 connected to this constant voltage circuit 126 by using a voltage value from a battery 144 (006P 9[V]) or an external direct current power (EXT DC) voltage (+6[V]). DC 3.5 [V] is similarly supplied to an IC (IC1 3361) 110 described later as a power voltage.

The band pass filter 105 processes an unnecessary component outside a frequency band with respect to a signal inputted from the high frequency amplifying circuit 104, and outputs the processed signal to the IC (IC1 3361) 110. In the IC 110, the receiving signal from the band pass filter 105 and the signal of a frequency from a local oscillating section having a crystal resonator (X1) 122 and an oscillator (OSC) circuit 112 constructed within the IC 110 are mixed by a mixer circuit (MIX) 111 constructed within the IC 110, and the receiving signal is set to a signal in an intermediate frequency band (e.g., a central frequency of 455 [kHz]). A channel change-over switch 123 is arranged to switch the connection of an inductor 124 to the other end of the crystal resonator 122 and the ground, or the connection of the other end of the crystal resonator 122 to the ground without connecting the inductor 124 to cope with the receiving signal of e.g., two channels (CH1 and CH2).

When the inductor 124 is connected to the crystal resonator 122 by the channel change-over switch 123 (on a CH1 side), the oscillating frequency of the local oscillating section can be set to a frequency of the CH1. Further, the fine adjustment of an arbitrary channel can be made by adjusting a core of the inductor 124. When the channel change-over switch 123 is switched onto this CH1 side, the oscillating frequency of the local oscillating section can be set to a low frequency in comparison with the case in which the connection to the ground is made without connecting the inductor 124. In other words, when no inductor 124 is connected to the crystal resonator 122 by the channel change-over switch 123 (on a CH2 side), the oscillating frequency can be set to a high frequency in comparison with the CH1 side. For example, the difference between the oscillating frequencies of the CH1 and the CH2 can be set to several ten [kHz] by the switching of the channel change-over switch 123. This local oscillating section will be described later in detail.

In FIG. 1, the receiving signal set to the intermediate frequency band by mixing this receiving signal with the frequency from the local oscillating section by the mixer circuit 111 is inputted to an intermediate frequency limiter amplifying circuit (IF LIM AMP) 113, and the intermediate frequency is amplified in this intermediate frequency limiter amplifying circuit 113. Processing such as noise removal processing is performed with respect to a signal except for a predetermined frequency range with the intermediate frequency e.g., 455 [kHz] as a central frequency by a ceramic filter (FL1) 121 connected to the intermediate frequency limiter amplifying circuit 113.

An output of the intermediate frequency limiter amplifying circuit 113 is inputted to a quadrature demodulating circuit (DET) 114, and the received modulating signal is demodulated (e.g., FM demodulation is performed when the receiving signal is an FM modulating signal) by this quadrature demodulating circuit 114. An output of the quadrature demodulating circuit 114 is inputted to a noise amplifying circuit 115 within the IC 110, and is also inputted to a low frequency amplifying circuit (AF AMP:Q3) 127 outside the IC 110 through a volume circuit (VR1) 140.

The noise amplifying circuit 115 amplifies a noise with respect to an input signal, and outputs the noise amplifying signal to a switch 116. The switch 116 outputs a battery level information signal to a light emitting diode (D1) 125 by utilizing the noise amplifying signal, and can emit light from the light emitting diode 125 and can turn off the light emitting diode 125 when a direct current voltage from a battery 144 is reduced.

The low frequency amplifying circuit 127 amplifies a signal in the low frequency band of a hearable frequency band with respect to the input signal, and outputs this amplified signal to a level detecting circuit (DET:Q4) 128. A signal detected in level by the level detecting circuit 128 is inputted in parallel to each of switches (Q5) 130, (Q6) 131, (Q7) 132, (Q8) 133 and (Q9) 134. 9 [V] from the battery 144 or +6 [V] from the external direct current power voltage is applied to the switches 130 to 134. Further, light emitting diodes (D3) 135, (D4) 136, (D5) 137, (D6) 138 and (D7) 139 are respectively connected to the switches 130 to 134. 9 [V] from the battery 144 or +6 [V] from the external direct current power voltage is also applied to the light emitting diodes 135 to 139. Here, the battery 144 and the external direct current power voltage are constructed in parallel with each other so as to apply a DC voltage. A voice level meter for displaying a voice level of the receiving signal by light emission of the light emitting diodes is constructed by the level detecting circuit 128, the switches 130 to 134, the light emitting diodes 135 to 139, etc.

The volume circuit 140 adjusts a sound volume with respect to the signal inputted from the quadrature demodulating circuit 114, and inputs this adjusted signal to a low frequency power amplifying circuit (AF PA AMP:IC2) 141. The low frequency power amplifying circuit 141 amplifies power in a low frequency band for outputting a voice from a speaker 142, and outputs the receiving signal by a sound by the speaker 142.

Figure 3:
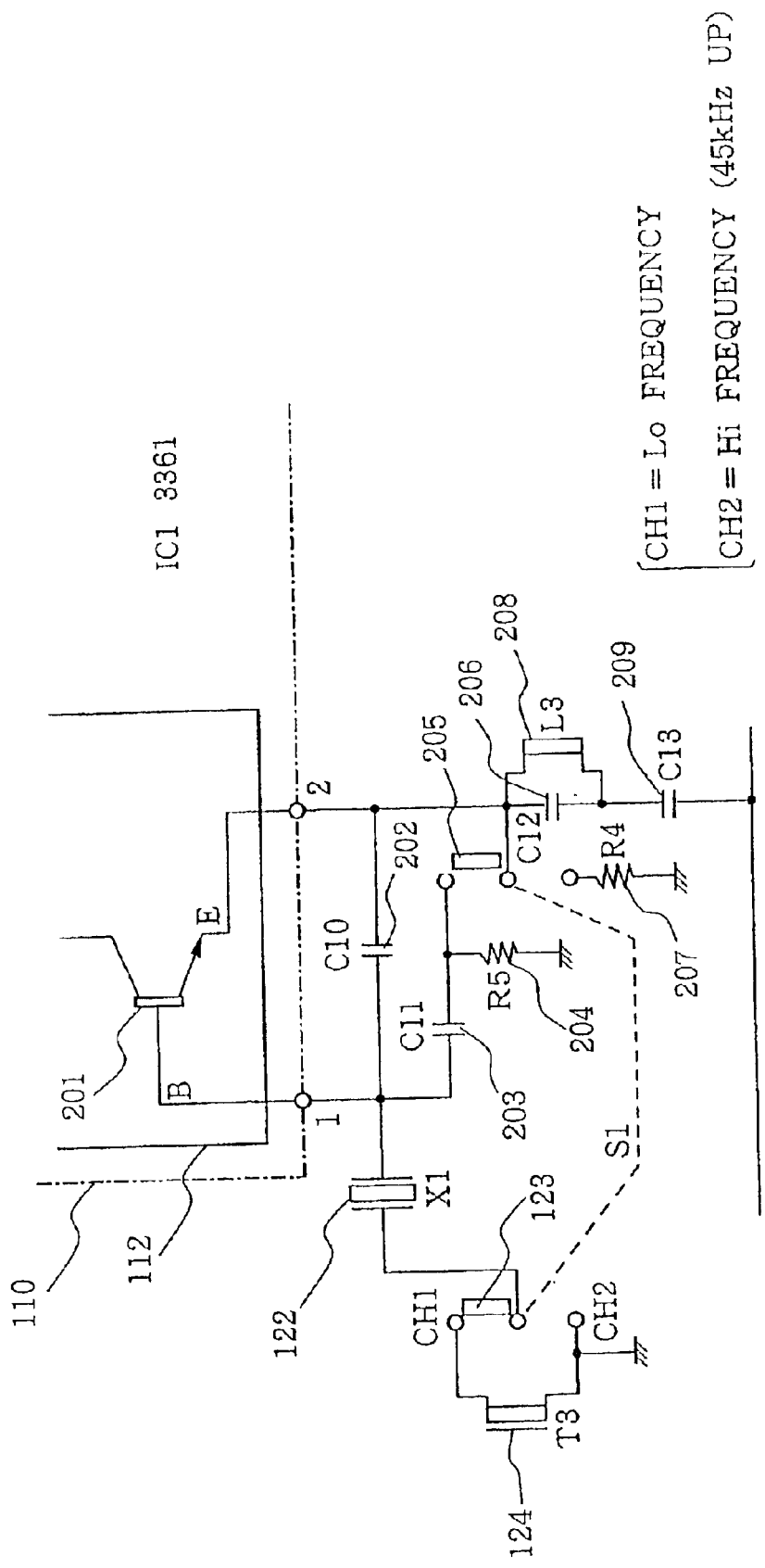
FIG. 3 is an enlarged view showing the circuit construction of an oscillating section having a crystal resonator in the receiving section of FIG. 1.

The local oscillating section of this embodiment will next be explained by using FIG. 3. FIG. 3 is an enlarged view showing the circuit construction of an oscillating section having a crystal resonator in the receiving section of FIG. 1. In FIG. 3, the same reference numerals and characters as FIG. 1 designate constructional elements similar to those in FIG. 1.

The channel change-over switch 123 switches whether or not the inductor (T3) 124 is connected in series to the other end of the crystal resonator 122. When the channel is set to CH1, the channel change-over switch 123 connects the inductor 124 in series to the other end of the crystal resonator 122 and the ground. When the channel is set to CH2, the channel change-over switch 123 directly connects the other end of the crystal resonator 122 to the ground without connecting the inductor 124. The crystal resonator 122 oscillates a predetermined oscillating frequency as the CH1 or the CH2. The channel can be accurately set to an arbitrary channel by finely adjusting a core of the inductor 124 by an unillustrated adjusting means. The outputs signal of predetermined oscillating frequency by this crystal resonator 122, etc. is amplified by a transistor 201 is provided to an oscillator circuit 112 and connected to one end of the crystal resonator 122, and an oscillator circuit 112 outputs this amplified signal to the above mixer circuit 111.

An adjusting change-over switch 205 is switched to the CH1 or the CH2 in association with the switching of the CH1 or the CH2 using the channel change-over switch 123 (see a dotted line of FIG. 3). Here, FIG. 3 shows that each of the channel change-over switch 123 and the adjusting change-over switch 205 is switched onto the CH1 side.

When the adjusting change-over switch 205 is switched onto the CH1 side in association with the switching of the channel change-over switch 123 onto the CH1 side, the feedback capacitors between the base (B) and the emitter (E) of the transistor 201 become the construction of a parallel circuit of a capacitor (C10) 202 and a capacitor (C11) 203. In accordance with this parallel circuit construction, a resistance circuit (R5) 204 is connected to an emitter terminal 2 as a resistor for control of a DC bias. When the channel change-over switch 123 is set to the CH1, the inductor 124 is connected in series to the crystal resonator 122 so that the oscillating frequency is shifted onto a low frequency side. However, oscillating frequency characteristics become unstable in accordance with temperature, etc. by the existence of the inductor 124. Therefore, the frequency characteristics are stabilized (a change in the oscillating frequency is stabilized) irrespective of temperature, etc., and oscillating intensity at the oscillating frequency is adjusted (an adjustment for uniforming the oscillating intensity is made) by the capacitors 202, 203 and the resistance circuit 204 connected to each other by the adjusting change-over switch 205.

When the adjusting change-over switch 205 is switched onto the CH2 side in association with the switching of the channel change-over switch 123 onto the CH2 side, the feedback capacitors become only the capacitor 202, and the resistor for DC bias control becomes a resistance circuit (R4) 207. Here, a circuit having a resistance value greater than that of the resistance circuit 207 is preferably used in the resistance circuit 204. In other words, a circuit having a resistance value smaller than that of the resistance circuit 204 is preferably used in the resistance circuit 207.

The parallel circuit of a capacitor (C12) 206 and an inductor (L3) 208 connected to an emitter terminal 2 constitutes a resonating circuit, and becomes an overtone circuit tuned with the frequency of about an integer times a fundamental frequency of the crystal resonator 122. For example, in the case of a signal multiplied three times in frequency of the receiving signal, the oscillating frequency from the crystal resonator 122 is multiplied three times, and is oscillated from the local oscillating section by this overtone circuit. A capacitor (C13) 209 arranged between the overtone circuit and 3.5 [V] provided by the constant voltage circuit 126 is operated as a bypass capacitor for DC cut.

When the fundamental frequency of the crystal resonator 122 is set to 16.624 [MHz] and the frequency of the CH1 is set to 49.845 [MHz] and the frequency of the CH2 is set to 49.890 [MHz] in one example of the wireless communication device having the receiving section of this embodiment, a transmitting signal of the CH1 or the CH2 can be received with high sensitivity, and a voice signal can be regenerated from this received signal. A high frequency circuit of this receiving section is mainly constructed by an IC (integrated circuit), one crystal resonator and a ceramic filter of 455 [kHz]. In this IC (integrated circuit), one transistor, a mixer circuit, a local oscillating circuit, an intermediate frequency amplifying circuit and a quadrature demodulating circuit (PLL demodulating circuit) are stored into one package.

Embodiment of Transmitting Section

Figure 4:
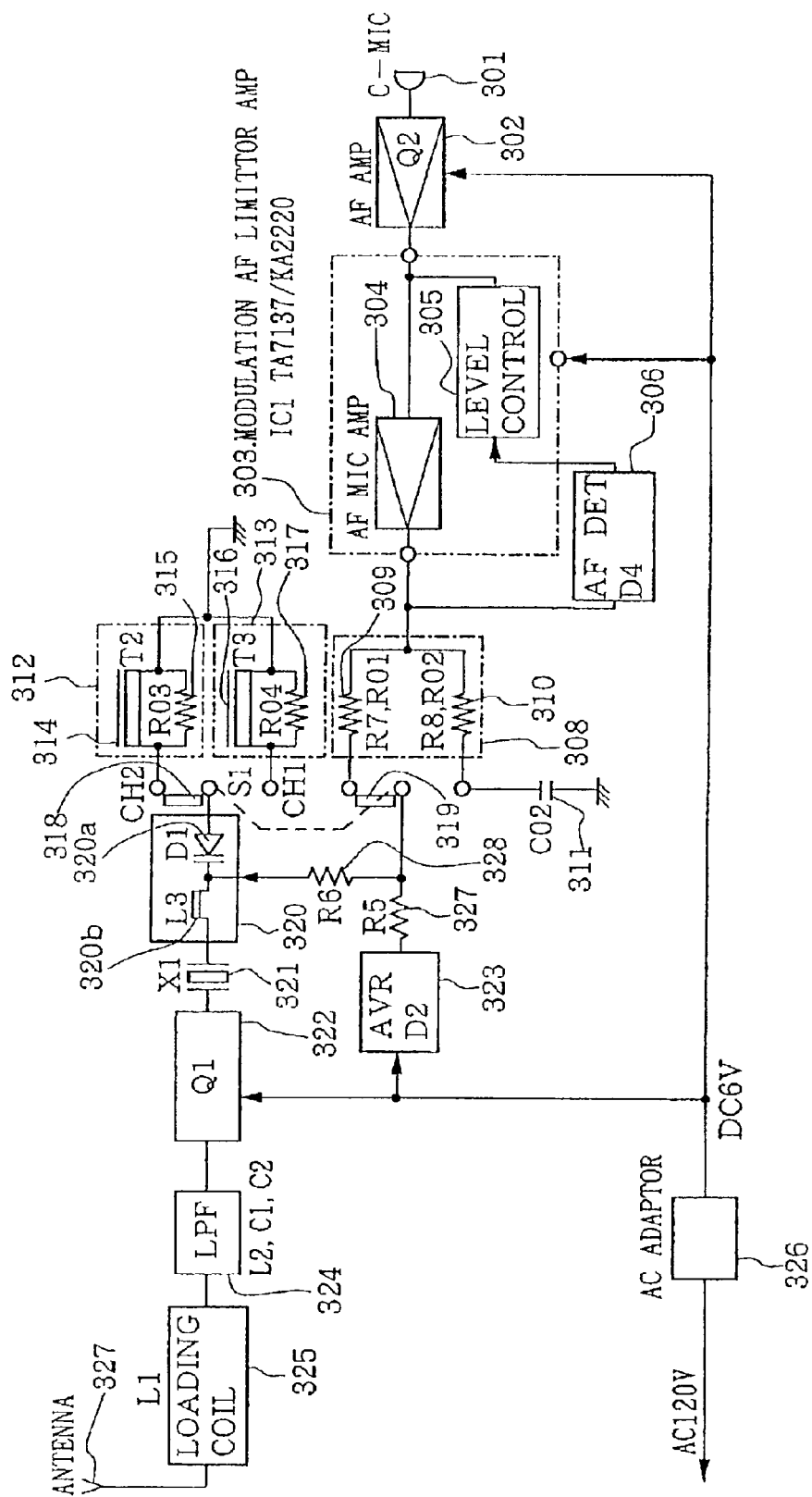
FIG. 4 is a block diagram showing the circuit construction of a transmitting section of the wireless communication device in accordance with one embodiment of this invention.
Figure 5:
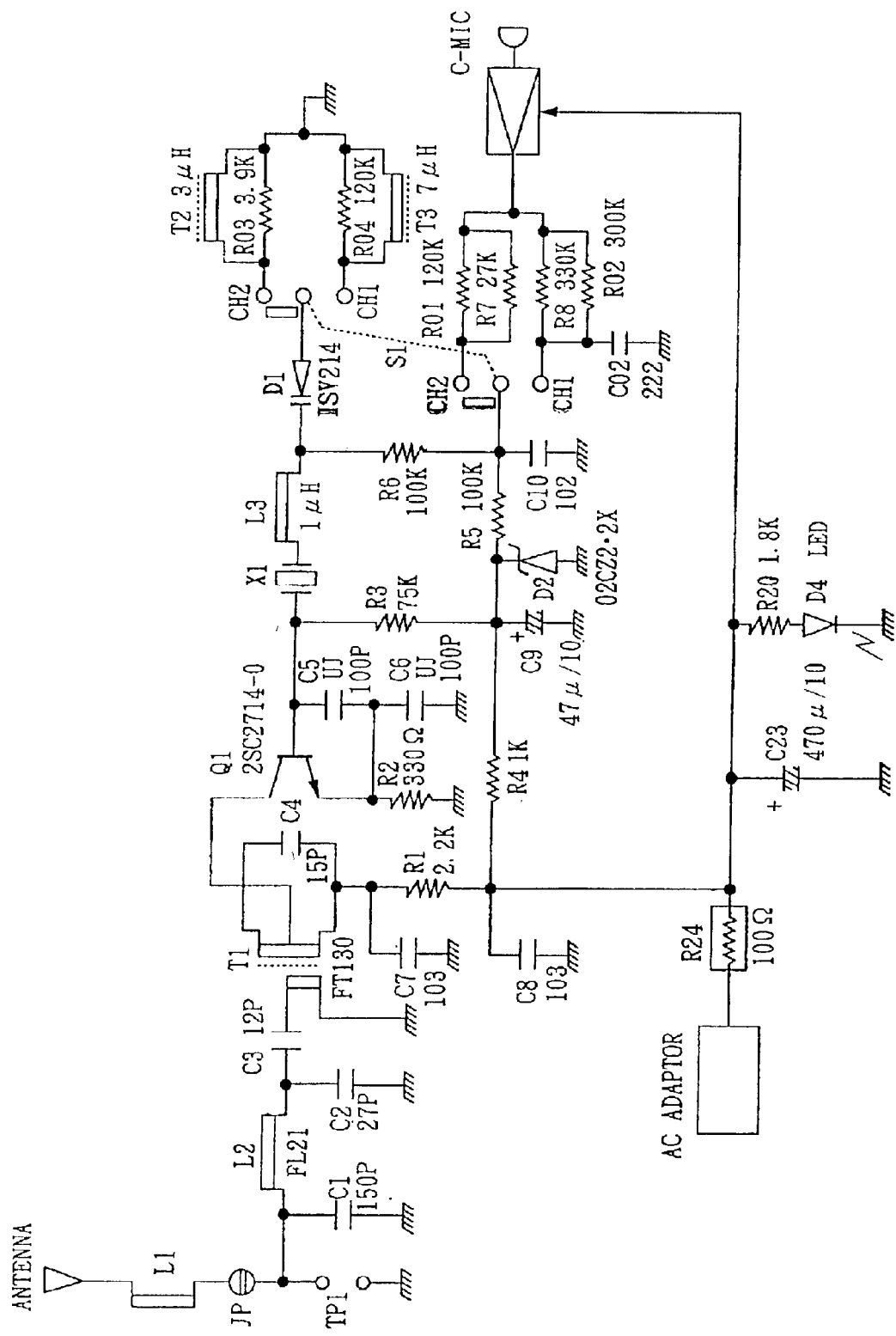
FIG. 5 is a view showing one concrete example of circuits shown in FIG. 4.

FIG. 4 is a block diagram showing the circuit construction of a transmitting section of the wireless communication device in accordance with one embodiment of this invention. FIG. 5 shows one concrete example of circuits of FIG. 4, and the same reference numerals and signs as FIG. 4 designate members similar to those in FIG. 4.

In FIG. 4, a microphone (C-MIC) 301 is an input section for inputting voice information as an input signal. An input signal from the microphone 301 is inputted to a low frequency amplifying circuit (AF AMP:Q2) 302, and is amplified in the low frequency band of a hearable frequency band (about 15 [Hz] to 20 [kHz]) in the low frequency amplifying circuit (Q2) 302. The amplified signal is then outputted to a modulation low frequency limiter amplifying circuit (MODULATION AF LIMITTOR AMP:IC1 TA7137/ KA2220) 303. Here, a direct current voltage (DC) 6 [V] from an AC adaptor 326 is applied to the low frequency amplifying circuit 302 as a power voltage. The AC adaptor 326 is connected to a general alternating current (AC) power plug socket (e.g., AC 120 [V]), and outputs DC 6[V]. The output of the AC adaptor 326 is also supplied to a high frequency amplifying and oscillating circuit 322 described later, and the power voltage is also applied to a modulating circuit (MODULATOR) 320 described later through a constant voltage circuit (AVR D2) 323 having a Zener diode.

The signal inputted from the low frequency amplifying circuit 302 to the modulation low frequency limiter amplifying circuit 303 is inputted to a low frequency microphone amplifying circuit (AF MIC AMP) 304 within the modulation low frequency limiter amplifying circuit 303, and the signal inputted to the microphone 301 is amplified. An output of the low frequency microphone amplifying circuit 304 is inputted to a low frequency detecting circuit (AF DET D3) 306, and the level of a low frequency signal is detected. Thereafter, this signal is fed back to the modulation low frequency limiter amplifying circuit 303. This fed back signal is inputted to a level control circuit (LEVEL CONTROL) 305 provided within the modulation low frequency limiter amplifying circuit 303, and level control of the input signal is performed by inputting a signal level-controlled by the level control circuit 305 as an input signal of the low frequency microphone amplifying circuit 304.

An output of the modulation low frequency limiter amplifying circuit 303 is inputted to a resistance circuit 308 for voice level control. In this embodiment, the circuit of the transmitting section for transmitting information at carrier frequencies of the two channels (CH1 and CH2) is constructed, the resistance circuit 308 for voice level control is constructed by resistance circuits 309 and 310 corresponding to the respective channels. This resistance circuit 308 for voice level control is a circuit functioning so as to constantly hold a modulation degree changed in association with a change in modulation sensitivity of the CH1 and the CH2.

The resistance circuits 309 and 310 are switched by a level control switching connection switch 319 so as to select the resistance circuit 310 in the case of the CH1 and select the resistance circuit 309 in the case of the CH2. In this embodiment, the frequency of the CH1 is transmitted from the transmitting section as a frequency (Lo FREQUENCY) lower than the frequency of the CH2. In other words, the frequency of the CH2 is transmitted from the transmitting section as a frequency (Hi FREQUENCY) higher than the frequency of the CH1.

In the respective resistance circuits 309, 310, a resistance value smaller than that of the resistance circuit 310 is used in the resistance circuit 309 for the CH2, and a resistance value greater than that of the resistance circuit 309 is used in the resistance circuit 310 for the CH1. For example, the resistance circuit 309 may be also constructed as a parallel circuit of resistors R7 and R01. For example, the resistance circuit 310 may be also constructed as a parallel circuit of resistors R8 and R02. The modulation sensitivity of the transmitting section is determined by the respective resistance values of these resistance circuits 309 and 310. A capacitor (C02) 311 connected to a terminal of the resistance circuit 308 for voice level control on its CH1 side is a capacitor for correcting high band frequency characteristics of the input signal.

A signal switched by the level control switching connection switch 319 and controlled in voice level by the resistance circuit 309 or 310 is inputted to a modulating circuit 320 having a variable capacitor (D1) 320a for modulation and an inductor (L3) 320b. The modulating circuit 320 FM-modulates this input information signal by deviating an oscillating frequency provided by a crystal resonator 321 by this input information signal. Concretely, a voltage applied to the variable capacitor 320a for modulation is changed by the input signal inputted from the resistance circuit 309 or 310 through a resistor (R6) 328, and the frequency of an oscillating section described later is changed so that the FM (frequency modulation) is performed. A constant DC voltage supplied from the constant voltage circuit 323 through resistors (R5) 327 and (R6) 328 is biased in the variable capacitor 320a for modulation.

The modulating circuit 320 is connected to the crystal resonator 321. A frequency setting adjusting circuit 312 or 313 is switched by a frequency switching connection switch (S1) 318 and is connected to the modulating circuit 320 so that the oscillating frequency is oscillated from the crystal resonator 321 by changing the frequencies of the CH1 and the CH2. Namely, the oscillating frequency of each channel is changed by the frequency setting adjusting circuit 312 or 313, and the CH1 and the CH2 are selected and set. Here, FIG. 3 shows that each of the level control switching connection switch 319 and the frequency switching connection switch 318 is switched onto the CH2 side.

The frequency setting adjusting circuit 312 includes an inductor (T2) 314, and the frequency setting adjusting circuit 313 includes an inductor (T3) 316. Here, an inductance smaller than that of the inductor 316 is used for the CH2 in the inductor 314. In other words, an inductance greater than that of the inductor 314 is used for the CH1 in the inductor 316. Further, the inductances of the inductors 314 and 316 can be finely adjusted by adjusting respective cores of the inductors 314 and 316 by an unillustrated adjusting means.

Each of the frequency setting adjusting circuits 312, 313 is constructed by a circuit in which a resistance circuit (R03) 315 is connected in parallel to the inductor 314 and a resistance circuit (R04) 317 is connected in parallel to the inductor 316 so as to dissolve instability of the oscillating frequency based on temperature, etc. due to the arrangement of each of the inductors 314, 316. Here, the resistance circuit 315 for the CH2 has a resistance value smaller than that of the resistance circuit 317. The resistance circuit 317 for the CH1 has a resistance value greater than that of the resistance circuit 315. The difference between the modulation degrees (modulation electric potentials) of the CH1 and the CH2 is predetermined in advance by the respective resistance values of these resistance circuits 315 and 317.

The level control switching connection switch 319 and the frequency switching connection switch 318 are switched onto the CH1 side or the CH2 side in association with each channel (see a dotted line of FIG. 3). The modulating circuit 320 FM-modulates the input signal switched and inputted by the level control switching connection switch 319 by the variable capacitor 320a for modulation, etc., and inputs the modulated input signal to the crystal resonator (X1) 321. As mentioned above, the input signal inputted to this crystal resonator 321 is a signal adjusted such that the modulation degree is constant in accordance with the modulation sensitivity of each channel. Here, the inductor L3 arranged in the modulating circuit 320 is constructed such that this inductor L3 is connected in series to the crystal resonator 321 to raise modulating efficiency.

The crystal resonator 321 sets the inputted modulating signal to an FM signal with a frequency set every channel as a central frequency by the frequency setting adjusting circuit 312 or 313 and the modulating circuit 320, and outputs the FM signal to the high frequency amplifying and oscillating circuit (Q1) 322. The high frequency amplifying and oscillating circuit 322 has a high frequency amplifying circuit (RF POWER AMP), a frequency three times multiplying circuit (3rd FREQUENCY) and an oscillating circuit (OSCILLATOR), and performs processing such as high frequency amplification and frequency three times multiplication with respect to the inputted signal. Processing such as removal of an unnecessary component is performed by a low pass filter (LPF) 324 having an inductor and a capacitor (L2, C1, C2) with respect to each signal processed by the high frequency amplifying and oscillating circuit 322. Thereafter, the processed signal is transmitted as a transmitting signal from an antenna 327 through a loading coil 325 having an inductor (L1). Here, an unillustrated junction point (JP) exists between the low pass filter 324 and the loading coil 325, and is constructed such that the low pass filter 324 and the loading coil 325 are connected to each other by solder, etc. The transmitting section can be easily constructed by arranging this JP such that no transmitting signal is transmitted from the antenna 327 when the transmitting section is tested, inspected, etc. Therefore, it is convenient to make the test, the inspection, etc.

In one example of the wireless communication device having the transmitting section of this embodiment, the fundamental frequency of the crystal resonator 122 is set to 16.624 [MHz] and 49.845 [MHz] is set to the CH1 and 49.890 [MHz] is set to the CH2 by the frequency setting adjusting circuit and the frequency three times multiplying circuit, etc. mentioned above with respect to an inputted voice signal. The signal can be stably transmitted as a transmitting signal at the frequency of the CH1 or the CH2 without the differences in modulation degree and modulation sensitivity. This transmitting section is mainly constructed by one microphone amplifier transistor, one IC for modulation amplification and modulation control, one modulation signal rectifying diode, one diode for FM, one crystal resonator, one oscillating and transmitting transistor and one constant voltage diode.

Embodiment of Transmitting-receiving System

In this embodiment, an embodiment showing the real measuring result of a transmitting-receiving system using the receiving section and the transmitting section in accordance with one embodiment of this invention will be explained.

In the transmitting-receiving system using the receiving section and the transmitting section in each of the above embodiments, information can be transmitted and received by using a frequency in a wireless frequency band of 10 [MHz] to 5 [GHz] by the above local oscillating section of the receiving section, the modulating circuit of the transmitting section, the oscillating section, etc. An information signal at a frequency of example 1 and/or example 2 shown below is first transmitted and received. In the cases of the examples 1 and 2, it has been confirmed that a frequency stable degree in the oscillating section having the crystal resonator (X1) of each of the receiving section and the transmitting section can satisfy the inspecting standard of FCC, and information can be transmitted and received.

EXAMPLE 1

Fundamental frequency of X1: 16.623833 [MHz]
Frequency of CH1: 49.845 [MHz]
Frequency of CH2: 49.890 [MHz]

EXAMPLE 2

Fundamental frequency of X1: 16.618833 [MHz]
Frequency of CH1: 49.830 [MHz]
Frequency of CH2: 49.875 [MHz]

Examples 3 and 4 are shown below as other examples of the above transmitting-receiving system. Similar to the cases of the above examples 1 and 2, it has been also confirmed in the cases of the example 3 and/or the example 4 that the frequency stable degree in the oscillating section having the crystal resonator (X1) of each of the receiving section and the transmitting section can satisfy the inspecting standard of FCC, and information can be transmitted and received.

EXAMPLE 3

Fundamental frequency of X1: 49.435 [MHz]
Frequency of CH1: 49.845 [MHz]
Frequency of CH2: 49.890 [MHz]

EXAMPLE 4

Fundamental frequency of X1: 49.420 [MHz]
Frequency of CH1: 49.830 [MHz]
Frequency of CH2: 49.875 [MHz]

In this embodiment, the oscillating frequency of the local oscillating section is changed between plural channels (e.g. two channels of the CH1 and the CH2) by switching the channel change-over switch and the adjusting change-over switch in the receiving section, and switching the frequency switching connection switch and the level control switching connection switch in the transmitting section in each of the above embodiments. Thus, it has been found that the difference in central frequency between the CH1 and the CH2 can be set to 45 [kHz] at its maximum, and the information signal can be transmitted and received by using the frequency of the CH1 or the CH2.

In each of the above embodiments, since the information signal is transmitted and received by using one crystal resonator in the plural channels, a compact communication system can be provided at low cost, a wireless communication system having a high general purpose property and satisfying the inspecting standard of FCC, etc. can be provided. Further, in the above receiving section, it is possible to provide a wireless communication device for receiving transmitting signals of the plural channels with high sensitivity by using one crystal resonator. Further, in the above device in the embodiments, the wireless communication can be realized until five channels at its maximum, and information can be transmitted and received by using the plural channels so that it is also possible to cope with the problem of radio interference.

Advantage of the Invention

As explained above, the following effects are obtained in accordance with this invention:

(1) In the wireless communication device of this invention, the local oscillating section has a single crystal resonator, an inductor and a switch for switching whether the inductor is connected in series to the crystal resonator or not. A receiving channel is switched by whether the inductor is connected or not. Accordingly, it is possible to provide a receiving section able to receive plural channels by one crystal resonator. Further, since the local oscillating section is constructed by one crystal resonator, the wireless communication device having a compact receiving section at low cost can be provided.

(2) The local oscillating section has a transistor having a base connected to one end of the crystal resonator, a capacitor connected between the base and an emitter of the transistor, an emitter resistor for connecting the emitter to the ground, and a parallel resonating circuit connected in parallel with the emitter resistor and synchronized with the frequency of about an integer times a fundamental frequency of the crystal resonator. The switch switches whether the other end of the crystal resonator is directly connected to the ground, or the other end of the crystal resonator is connected to the ground through the inductor, and capacitance of the capacitor is switched in association with this switching. Therefore, the oscillating frequency of the local oscillating section instabilized by temperature, etc. can be stabilized by the capacitance of the capacitor in association with each channel, can be stabilized by the oscillating frequency of the local oscillating section.

(3) The switch further switches a resistance value of the emitter resistor in association with the switching of the receiving channel. Therefore, an adjustment for uniforming oscillating strength of the oscillating frequency is made and the local oscillating section can be further stably operated. Accordingly, it is possible to provide a wireless communication device having the receiving section of a high general purpose property and conforming to the standard of America Federal Communications Commission.

(4) In the wireless communication device of this invention, a modulating section has a single crystal resonator, a modulating circuit for deviating an oscillating frequency provided by the crystal resonator by an inputted information signal, an inductor connected in series to the crystal resonator, and a switch for switching inductance of the inductor, and a transmitting channel is switched by switching this inductance. Accordingly, it is possible to provide a transmitting section for transmitting information by arbitrarily selecting the plural channels. Further, since only one crystal resonator is arranged, it is possible to provide a wireless communication device having a compact transmitting section at low cost.

(5) A resistor is connected in parallel with the inductor, and its resistance value is switched in association with the switching of the transmitting channel. Therefore, amplitude (electric potential) at the oscillating frequency instabilized by temperature, etc. is stabilized by arranging the inductor.

(6) The modulating section switches a level of the inputted information signal in association with the switching of the transmitting channel. Therefore, a further stable oscillating means can be constructed so that a wireless communication device having a transmitting section having a high general purpose property and conforming to the standard of America Federal Communications Commission can be provided.

Further, this invention can be constructed as a transmitting-receiving system for transmitting and receiving wireless information, and can provide a compact transmitting-receiving system manufactured at low cost and conforming to the standard and able to use the plural channels.

What is claimed is:

1. A wireless communication device having a local oscillating section for oscillating a frequency for converting a wirelessly transmitted and received signal to a signal in an intermediate frequency band, wherein said local oscillating section has a single crystal resonator, an inductor and a switch for switching whether said inductor is connected in series to said crystal resonator or not, and a receiving channel is switched by whether said inductor is connected or not.

2. A wireless communication device according to claim 1, wherein said local oscillating section has a transistor having a base connected to one end of said crystal resonator, a capacitor connected between the base and an emitter of the transistor, an emitter resistor for connecting the emitter to the ground, and a parallel resonating circuit connected in parallel with the emitter resistor and synchronized with the frequency of about an integer times a fundamental frequency of said crystal resonator, and said switch switches whether the other end of said crystal resonator is directly connected to the ground, or the other end of said crystal resonator is connected to the ground through said inductor, and capacitance of said capacitor is switched in association with this switching.

3. A wireless communication device according to claim 2, wherein said switch further switches a resistance value of said emitter resistor in association with the switching of said receiving channel.

4. A wireless communication device having a modulating section for frequency-modulating an inputted information signal, wherein said modulating section has a single crystal resonator, a modulating circuit for deviating an oscillating frequency provided by the crystal resonator by said inputted information signal, an inductor connected in series to the crystal resonator, and a switch for switching inductance of the inductor, and a transmitting channel is switched by switching this inductance.

5. A wireless communication device according to claim 4, wherein a resistor is connected in parallel with said inductor, and its resistance value is switched in association with the switching of said transmitting channel.

6. A wireless communication device according to claim 5, wherein a level of said inputted information signal is switched in association with the switching of said transmitting channel.

* * * * *